(12) United States Patent
Bauer et al.

(10) Patent No.: US 7,843,055 B2
(45) Date of Patent: Nov. 30, 2010

(54) SEMICONDUCTOR DEVICE HAVING AN ADHESION PROMOTING LAYER AND METHOD FOR PRODUCING IT

(75) Inventors: Michael Bauer, Nittendorf (DE); Markus Brunnbauer, Lappersdorf (DE); Edward Fuergut, Dasing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 615 days.

(21) Appl. No.: 11/733,555

(22) Filed: Apr. 10, 2007

(65) Prior Publication Data

US 2007/0235857 A1 Oct. 11, 2007

(30) Foreign Application Priority Data

Apr. 10, 2006 (DE) .................. 10 2006 017 115

(51) Int. Cl.
*H01L 23/48* (2006.01)
*H01L 23/14* (2006.01)

(52) U.S. Cl. .............. 257/688; 257/702; 257/E21.499; 977/902

(58) Field of Classification Search ......... 257/678–733, 257/787–796, E23.001–E23.194, E21.499–E21.519; 438/15, 26, 51, 55, 64, 106, 124–127; 977/902
See application file for complete search history.

(56) References Cited

U.S. PATENT DOCUMENTS

| | | | |
|---|---|---|---|
| 5,122,858 A | 6/1992 | Mahulikar et al. | |
| 6,841,857 B2 | 1/2005 | Beer et al. | |
| 7,528,485 B2 * | 5/2009 | Morita et al. | 257/735 |
| 7,642,641 B2 * | 1/2010 | Mahler et al. | 257/701 |
| 7,645,636 B2 * | 1/2010 | Wombacher | 438/118 |
| 2002/0024138 A1 * | 2/2002 | Shimoto et al. | 257/753 |
| 2003/0148024 A1 * | 8/2003 | Kodas et al. | 427/125 |
| 2005/0082681 A1 * | 4/2005 | Wijdenes | 257/778 |
| 2005/0133863 A1 | 6/2005 | Werner et al. | |
| 2005/0161210 A1 | 7/2005 | Zhong et al. | |
| 2005/0252398 A1 * | 11/2005 | Ohkura et al. | 101/368 |
| 2006/0022326 A1 * | 2/2006 | Morita et al. | 257/692 |
| 2007/0001319 A1 * | 1/2007 | Bauer et al. | 257/783 |
| 2007/0108637 A1 * | 5/2007 | Wombacher | 257/788 |
| 2007/0172980 A1 * | 7/2007 | Tanaka et al. | 438/106 |
| 2008/0093728 A1 * | 4/2008 | Mahler et al. | 257/701 |
| 2008/0108218 A1 * | 5/2008 | Kodas et al. | 438/610 |

FOREIGN PATENT DOCUMENTS

| | | |
|---|---|---|
| DE | 102 32 788 | 2/2003 |
| DE | 103 36 747 | 3/2005 |
| DE | 10 2004 058 305 | 5/2006 |
| DE | 102005054267 | 5/2007 |
| WO | 2006058510 | 6/2006 |

* cited by examiner

*Primary Examiner*—David S Blum
(74) *Attorney, Agent, or Firm*—Dicke, Billig & Czaja, PLLC

(57) ABSTRACT

A semiconductor device and a method for producing it is disclosed. In one embodiment, an adhesion-promoting layer having nanoparticles is arranged between a circuit carrier and a plastic housing composition for the purpose of enhanced adhesion.

20 Claims, 5 Drawing Sheets

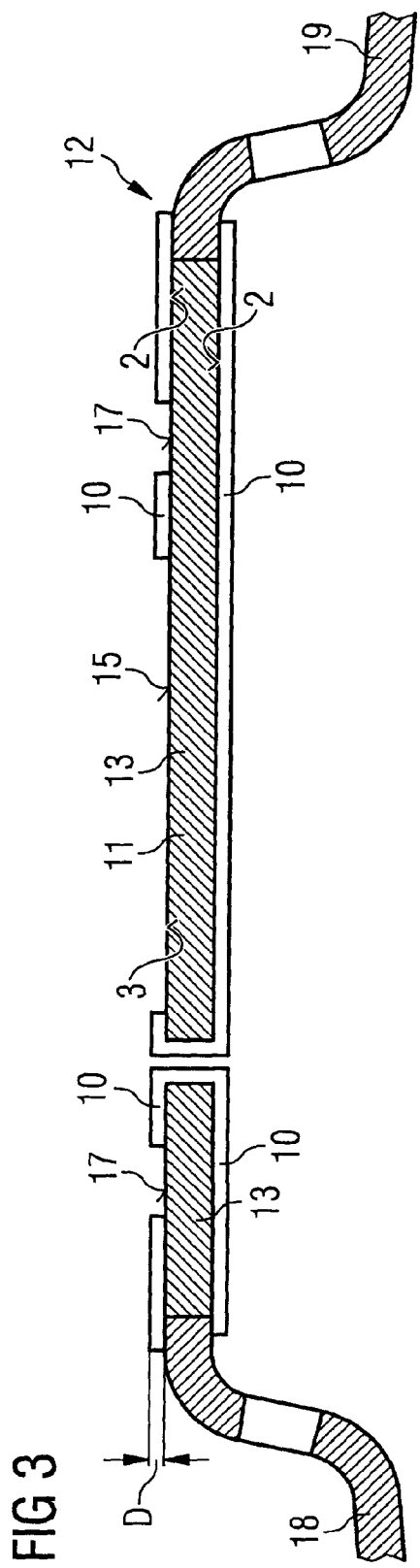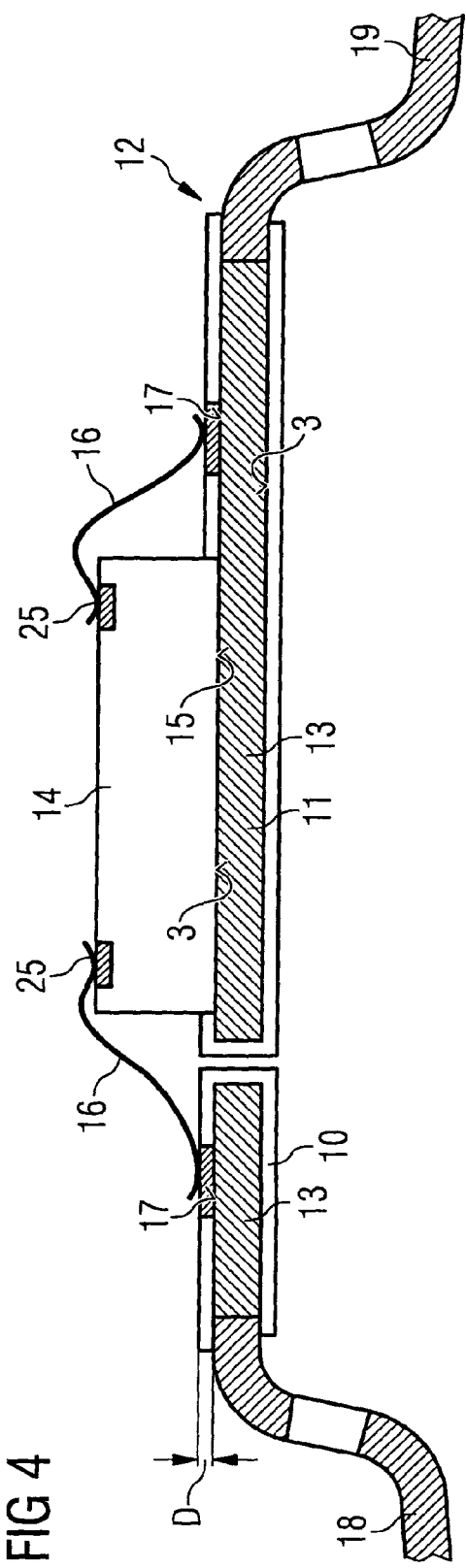

SEMICONDUCTOR DEVICE HAVING AN ADHESION PROMOTING LAYER AND METHOD FOR PRODUCING IT

CROSS-REFERENCE TO RELATED APPLICATIONS

This Utility Patent Application claims the benefit of the filing date of German Application No. DE 10 2006 017 115.2, filed Apr. 10, 2006, which is herein incorporated by reference.

BACKGROUND

The invention relates to a semiconductor device and to a method for producing it.

In semiconductor devices, delamination of, for example, a plastic housing from the circuit carrier can occur under loading. Adhesion-promoting layers between interfaces of different components of the semiconductor devices are intended to contribute to enhancing the inadequate adhesion of the plastic housing composition to the relevant surfaces and/or interfaces in semiconductor devices. Such inadequate adhesion results in increased failure and constitutes fault risks in semiconductor devices which can cause the devices to fail, in particular during device qualification.

The ingress of moisture into such interfaces is particularly hazardous, with the result that, when a semiconductor device is being soldered onto a superordinate circuit board, the "popcorn" effect can occur which may involve semiconductor device components, in particular plastic housing parts, chipping off from the surface of the circuit carrier.

An attempt has hitherto been made in some instances to roughen the surfaces of circuit carriers, which form an interface with the plastic housing composition, by mechanical preprocessing. An attempt has also been made to apply a surface structure with undercuts by physicochemical methods such as plasma etching or by a series of cascaded galvanic processes and in this way to achieve enhanced interlinking of the interfaces of different components.

DE 10 2005 054 267 proposes using a layer, which is applied using electrospinning methods and has undercuts, on surfaces of circuit carriers as an adhesion promoter. However, these previous adhesion-enhancing measures are relatively complicated and do not adequately enhance the adhesion of the molding composition, in particular to metallic surfaces. Moreover, devices having adhesively bonded chips cannot be treated using wet-chemical methods.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2 to 5 illustrate diagrammatic illustrations for producing a semiconductor device having a layer according to the first embodiment of the invention.

FIG. 2 illustrates a diagrammatic cross section through a circuit carrier having a protective layer before coating with the adhesion-promoting layer.

FIG. 3 illustrates the diagrammatic cross section of the circuit carrier illustrated in FIG. 2 after a layer according to the invention has been applied and after the protective layer has been removed.

FIG. 4 illustrates a diagrammatic cross section of the circuit carrier after contact pads have been applied and after a semiconductor chip has been fixed and after the contact areas of the semiconductor chip have been connected to the contact pads of the circuit carrier.

FIG. 5 illustrates the diagrammatic cross section of a semiconductor device after a plastic housing composition has been applied to the circuit carrier.

DETAILED DESCRIPTION

Figure 1:
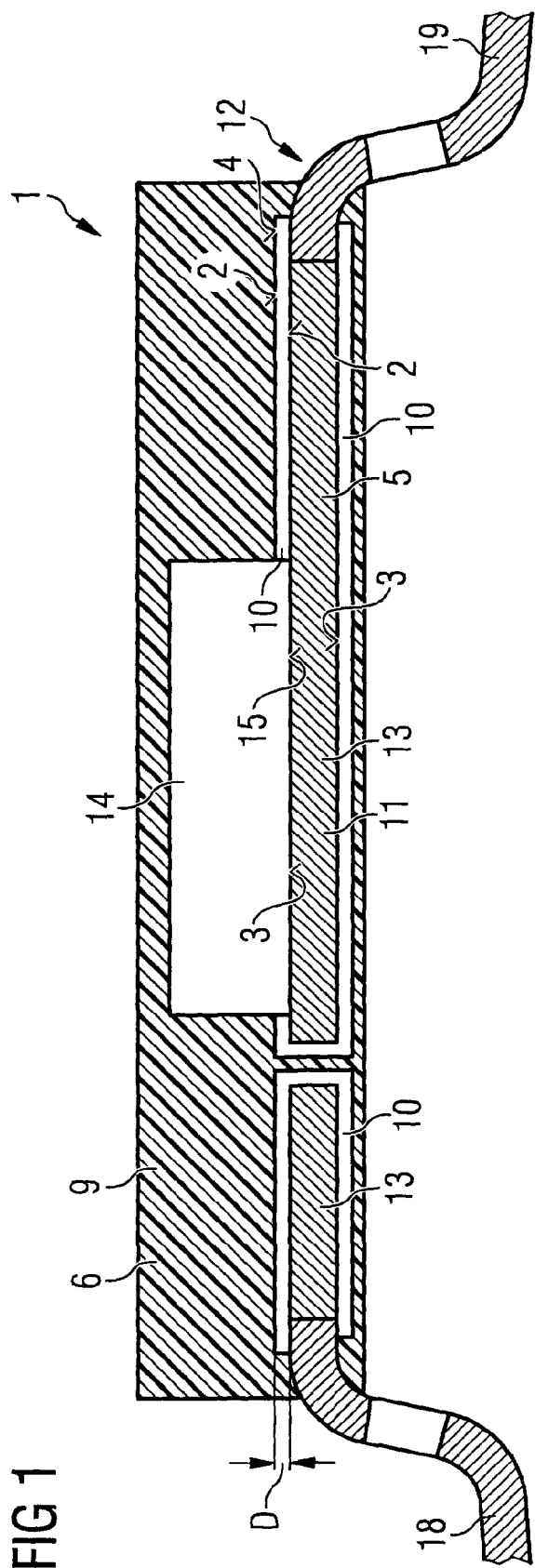
FIG. 1 illustrates a diagrammatic cross section through a semiconductor device having a layer according to a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a semiconductor device having a layer that can be used between interfaces of different components in semiconductor devices and reliably promotes adhesion between the interfaces. In addition, one or more embodiments provide a simple method for producing such a semiconductor device.

According to one embodiment, in a semiconductor device having a circuit carrier and at least one semiconductor chip which is arranged on a circuit substrate, surface regions of the semiconductor chip and of the circuit carrier form interfaces to further components of the semiconductor device, for example to a plastic housing composition. At least regions of the interfaces are provided with an adhesion-promoting layer, the adhesion-promoting layer having a polymer containing embedded mineral-ceramic nanoparticles.

According to a basic concept, the interfaces have undercuts and/or surface-active substances for good adhesion promotion. However, the production of undercuts directly in the surfaces of the circuit carrier and of the plastic housing should be avoided on account of the associated disadvantages—such as high technical complexity and restriction to chips which are not adhesively bonded in wet-chemical processes. Instead, an adhesion-promoting layer should be provided between the interfaces. As has emerged, mineral-ceramic nanoparticles afford surfaces which project from the polymer matrix and to which molecules of further components, for example silanes of a plastic housing composition, can be anchored.

Polymers based on polybenzoxazole (PBO) or polyimide (PI), which exhibit relatively good adhesion to different surfaces, are particularly suitable as polymers for the polymer matrix. In one embodiment of the invention, the mineral-ceramic nanoparticles are $SiO_2$ particles.

In one embodiment of the invention, the nanoparticles have an average particle size k in the range of 10 nm≦k<1000 nm, 10 nm≦k<100 nm. With this average particle size, the mineral-ceramic nanoparticles reach a size which is suitable for application to a metal layer and prevents deep scratches and interruptions and breaks from being able to occur.

The adhesion-promoting layer has a thickness D in the range of 1 μm≦k≦50 μm. It is suitable for coating metallic surfaces, for example of copper, silver, gold and/or palladium, to which sufficiently reliable adhesion of the plastic housing composition is particularly difficult to achieve using conventional methods.

In one or more embodiments, the semiconductor device has the surface-active nanoparticles which project from the polymer matrix that provide a reliable adhesion effect of the plastic housing composition to the circuit carrier. In addition, the adhesion-promoting layer absorbs less moisture than a polymer layer alone on account of the nanoparticles embedded in the polymer matrix and has a lower coefficient of thermal expansion than a pure polymer layer. Mechanical stresses between the adhesion promoter layer and metallic surface regions, in particular, are thus considerably reduced.

According to another embodiment, a method for producing a semiconductor device includes at least the following methods: a circuit carrier having metallic surfaces which are provided as interfaces to further components of the semiconductor device is produced. At least one semiconductor chip is applied to the circuit carrier. Regions of the interfaces of the circuit carrier—which are intended to be coated—and, if appropriate, also of the semiconductor chip are provided with an adhesion-promoting layer before or after applying the semiconductor chip, the adhesion-promoting layer having a polymer containing embedded mineral-ceramic nanoparticles. Electrical connections are then produced between the semiconductor chip and coating-free contact pads of the circuit carrier, and the semiconductor chip and the electrical connections are embedded in a plastic housing composition whilst simultaneously applying the plastic housing composition to interfaces which have been coated with the adhesion promoter.

Those surface regions of the circuit carrier and/or of the semiconductor chip which are not intended to be coated with the adhesion-promoting layer are provided with a protective layer in order to selectively apply the adhesion-promoting layer. This protective layer is removed again after the layer has been applied.

The semiconductor chip and the electrical connections are embedded in the plastic housing composition, and the plastic housing composition is applied to the coated interfaces, using injection-molding technology. This method provides adhesion between metallic surfaces of the circuit carrier and the semiconductor chip and the plastic housing composition.

FIG. 1 illustrates a diagrammatic cross section through a semiconductor device 1 according to a first embodiment of the invention. In this first embodiment of the invention, the semiconductor device 1 is constructed on a circuit carrier 11 which is punched out of a leadframe 12.

The leadframe 12 has external leads 18 as external contacts 19 and internal leads 13 for connecting a semiconductor chip 14. In this case, the internal leads 13 are held by a plastic housing composition 9 which has an area of contact 4 with an interface 2 of the adhesion-enhancing layer 10. The internal leads 13 have surfaces 3 which are partially coated with the adhesion-enhancing layer 10.

The semiconductor chip 14 is carried by one of the internal leads 13 on a coating-free surface region 15 and is likewise embedded in the plastic housing composition 9. In this embodiment of the invention, the surfaces of the semiconductor chip 14 do not have an adhesion-enhancing layer. However, the remaining surfaces 3 of the internal leads 13 are completely coated with the adhesion-enhancing layer 10. The layer 10 has mineral-ceramic nanoparticles which are embedded in a polymer matrix.

Figure 2:
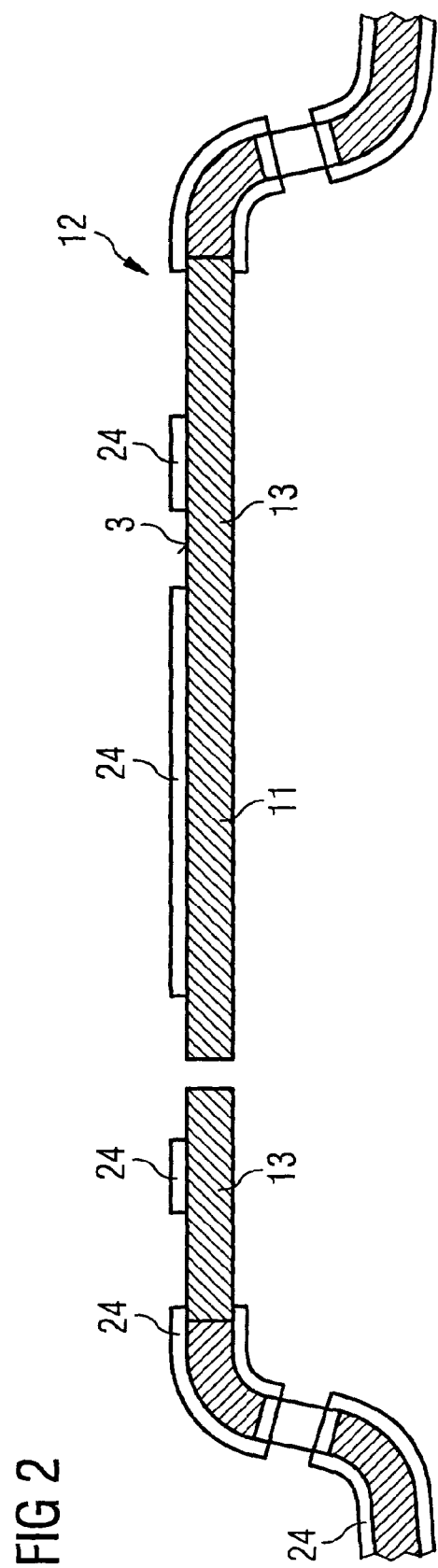

Before the layer 10 is applied, the circuit carrier 11 can be provided with a protective layer 24 in regions in which coating with the adhesion-promoting layer 10 is not desired, as illustrated in FIG. 2. The circuit carrier 11 is in turn part of a leadframe 12 and has internal leads 13 whose surfaces 3 are partially free of protective layers 24 so that the adhesion-enhancing layer 10 according to the invention can be applied to them. All of the surfaces 3 of the internal leads 13 which are kept free of the protective layer 24 can be selectively coated with the adhesion promoter.

FIG. 3 illustrates the diagrammatic cross section of the circuit carrier 11 illustrated in FIG. 2 after a layer 10 has been applied and after the protective layer 24 as illustrated in FIG. 2 has been removed. In this case, the external leads 18 and the protected contact pads 17 are held on the internal leads in such a manner that they are free of an adhesion-enhancing layer 10. In this method, the surface regions 15 of an internal lead 13 also remain free of an adhesion-enhancing layer 10 and may accommodate a semiconductor chip.

FIG. 4 illustrates the diagrammatic cross section of the circuit carrier 11 illustrated in FIG. 3 after a metallic coating has been applied to the contact pads 17 and after a semiconductor chip 14 has been fixed to the internal lead 13 and after electrical connections 16 have been produced between contact areas 25 of the semiconductor chip 14 and the metallized contact pads 17.

Figure 5:
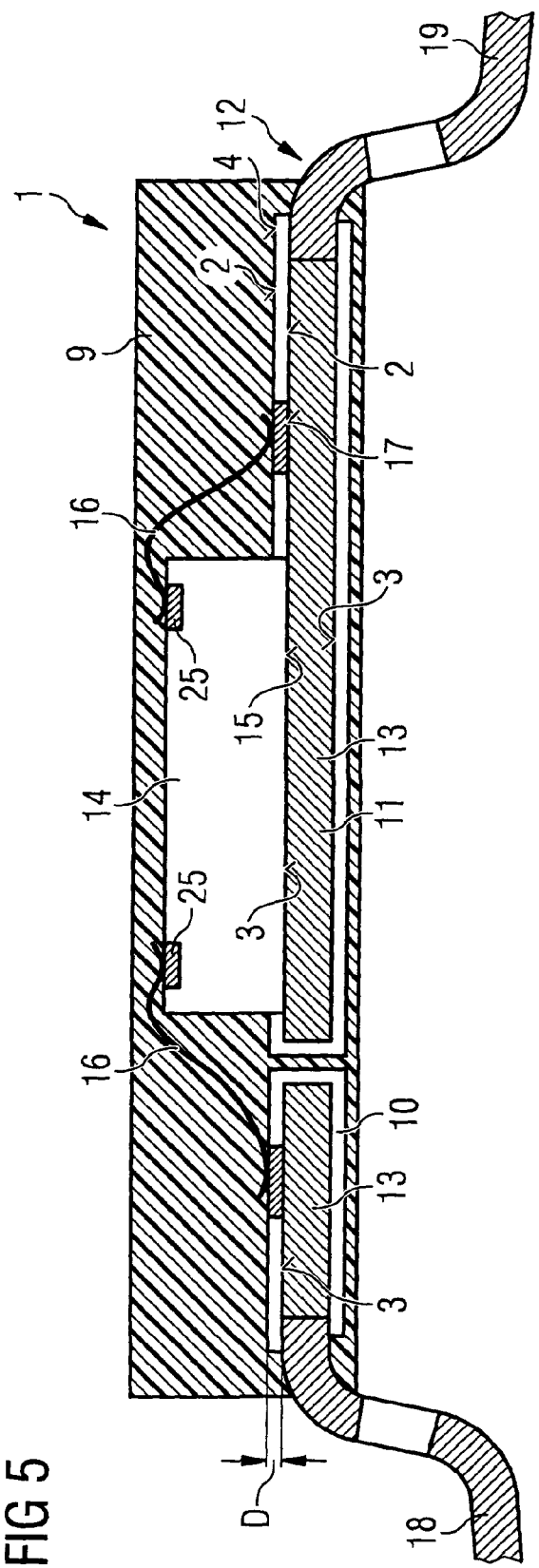

FIG. 5 illustrates a diagrammatic cross section through a semiconductor device 1 after a plastic housing composition 9 has been applied to the circuit carrier 11. In this case, the internal leads 13 are completely embedded in the plastic housing composition 9, if they do not carry a semiconductor chip 14, and are simultaneously mechanically connected to the plastic housing composition 9. The plastic housing is firmly anchored as a result of the surface-active nanoparticles in the layer 10, the nanoparticles projecting from the polymer matrix.

Figure 6:
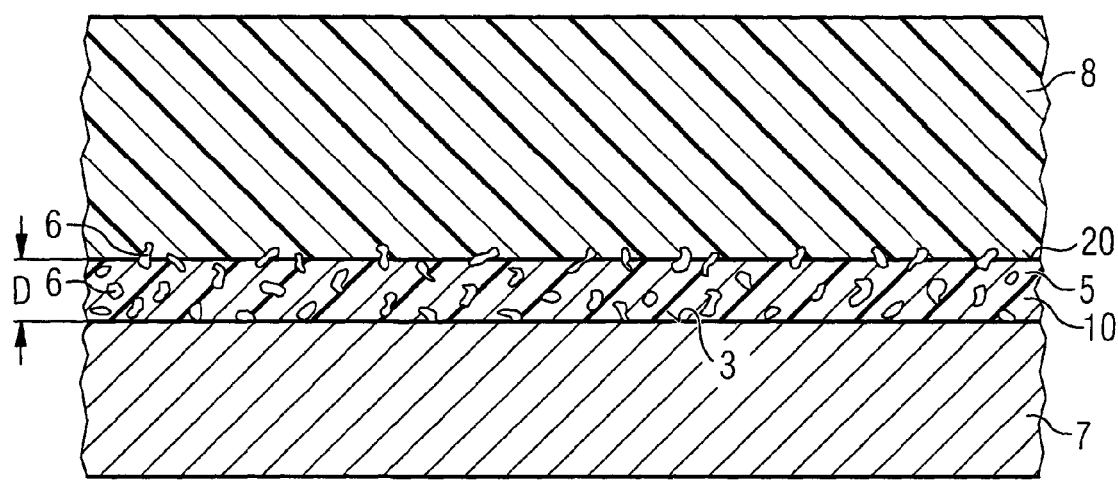
FIG. 6 diagrammatically illustrates the adhesion-promoting layer between two components of a semiconductor device.

FIG. 6 reveals how the adhesion-promoting layer 10 is arranged between a component 7 and a further component 8 of a semiconductor device. The layer 10 has a thickness D and includes a polymer matrix 5 with nanoparticles 6 embedded therein. The nanoparticles 6 project somewhat from the surface 20 of the polymer matrix and make it possible for the molecules of the further component 8, for example silanes of a plastic housing composition, to be anchored to the adhesion-promoting layer 10 in a stable manner. Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   at least one semiconductor chip arranged on a circuit substrate, surface regions of the semiconductor chip and of the circuit substrate forming interface locations for further components of the semiconductor device; and
   at least one of the interface locations having an adhesion-promoting layer disposed thereon, where the adhesion-promoting layer has a polymer containing embedded mineral-ceramic nanoparticles; and
   a plastic molding material encasing the at least one semiconductor chip and at least a portion of the circuit substrate, wherein a portion of the nanoparticles project from a surface of the adhesion promoting layer and act as anchors to which the plastic molding material bonds so as to be held in place thereby.

2. The semiconductor device of claim 1, wherein a polymer based on polybenzoxazole (PBO) is provided as the polymer.

3. The semiconductor device of claim 1, wherein a polymer based on polyimide (PI) is provided as the polymer.

4. The semiconductor device of claim 1, wherein $SiO_2$ nanoparticles are provided as the mineral-ceramic nanoparticles.

5. The semiconductor device of claim 1, wherein the mineral-ceramic nanoparticles have an average particle size k of $10\text{ nm} \leq k \leq 1000\text{ nm}$.

6. The semiconductor device of claim 1, wherein the mineral-ceramic nanoparticles have an average particle size k of $10\text{ nm} \leq k \leq 100\text{ nm}$.

7. The semiconductor device of claim 1, wherein the adhesion-promoting layer has a thickness D of $1\text{ }\mu\text{m} \leq k \leq 50\text{ }\mu\text{m}$.

8. The semiconductor device of claim 1, wherein the surface regions have metallic surfaces.

9. A semiconductor device comprising:
   a circuit substrate;
   at least one semiconductor chip arranged on the circuit substrate, where surface regions of the semiconductor chip and of the circuit substrate, other than surface regions between the semiconductor chip and the circuit substrate, form interfaces locations for further circuit components; and
   layer means for promoting adhesion disposed on the interfaces locations, the adhesion promoting layer means comprising a material containing a nanoparticles; and
   a plastic molding material encasing the semiconductor chip and at least a portion of the circuit substrate, wherein a portion of the nanoparticles project from a surface of the adhesion promoting layer and act as anchors to which the plastic molding material bonds so as to be held in place thereby.

10. A semiconductor device comprising:
    a circuit substrate;
    at least one semiconductor chip arranged on a circuit substrate; and
    an adhesion promoting layer disposed on portions of surface regions of the semiconductor chip and of the circuit substrate, said portions being outside of regions between the semiconductor chip and the circuit substrate, the adhesion promoting layer comprising a material containing nanoparticles; and
    a plastic molding material encasing the semiconductor chip and at least a portion of the circuit substrate, wherein a portion of the nanoparticles project from a surface of the adhesion promoting layer and act as anchors to which the plastic molding material bonds so as to be held in place thereby.

11. The semiconductor device of claim 10, wherein the circuit substrate comprises a leadframe having internal leads, wherein portions of the internal leads outside of portions to which the at least one semiconductor chip is bonded are coated with the adhesion promoting layer, wherein a portion of the nanoparticles project from a surface of the adhesion promoting layer and serve as anchors for securing a plastic molding material to be bonded thereto.

12. The semiconductor device of claim 10, comprising:
    where the nanoparticles are embedded mineral-ceramic nanoparticles.

13. The semiconductor device of claim 10, the material comprising a polymer.

14. The semiconductor device of claim 13, wherein the polymer is based on a polybenzoxazole (PBO).

15. The semiconductor device of claim 10, wherein the polymer is based on a polyimide (PI).

16. The semiconductor device of claim 10, comprising wherein the nonoparticles and are $SiO_2$ nanoparticles.

17. The semiconductor device of claim 10, comprising wherein the mineral-ceramic nanoparticles have an average particle size k of $10\text{ nm} \leq k \leq 1000\text{ nm}$.

18. The semiconductor device of claim 10, comprising wherein the nanoparticles have an average particle size k of $10\text{ nm} \leq k \leq 100\text{ nm}$.

19. The semiconductor device of claim 10, comprising wherein the adhesion-promoting layer has a thickness D of $1\text{ }\mu\text{m} \leq k \leq 50\text{ }\mu\text{m}$.

20. The semiconductor device of claim 10, wherein the surface region has a metallic surface.

* * * * *